United States Patent
Ogasawara

(10) Patent No.: US 9,148,124 B2
(45) Date of Patent: Sep. 29, 2015

(54) COMPLEX BAND PASS FILTER AND RECEIVER

(71) Applicant: Kabushiki Kaisha Toshiba, Minato-ku, Tokyo (JP)

(72) Inventor: Yosuke Ogasawara, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/464,039

(22) Filed: Aug. 20, 2014

(65) Prior Publication Data

US 2015/0214925 A1    Jul. 30, 2015

(30) Foreign Application Priority Data

Jan. 30, 2014   (JP) .................................. 2014-015484

(51) Int. Cl.
*H04B 1/10* (2006.01)
*H03H 11/04* (2006.01)
*H03H 11/36* (2006.01)

(52) U.S. Cl.
CPC ............. *H03H 11/04* (2013.01); *H03H 11/365* (2013.01); *H04B 1/10* (2013.01); *H03H 2011/0494* (2013.01)

(58) Field of Classification Search
CPC ............ H03H 1/0007; H03H 2001/0021; H03H 2/008; H03H 7/00; H03H 7/01; H03H 7/0107; H03H 7/0123; H03H 7/0138; H03H 7/0153; H03H 7/0161; H03H 7/0169; H03H 7/0176; H03H 7/06; H03H 7/065; H03H 7/075; H03H 7/12; H03H 7/17; H03H 2007/0192; H03H 11/00; H03H 11/02; H03H 11/04; H03H 11/0422; H03H 2011/0494
USPC .......................................... 375/316, 346, 350
See application file for complete search history.

(56) References Cited

U.S. PATENT DOCUMENTS

| 7,233,772 | B1 * | 6/2007 | Darabi et al. | .................... 455/20 |
| 2010/0207691 | A1 * | 8/2010 | Kim | .................................. 330/69 |
| 2010/0283538 | A1 * | 11/2010 | Zanchi et al. | .................... 330/69 |
| 2011/0189970 | A1 * | 8/2011 | Ohshiro | ........................ 455/302 |

FOREIGN PATENT DOCUMENTS

| JP | 2005-244412 A | 9/2005 |
| JP | 2008-167000 A | 7/2008 |
| JP | 2008-177897 A | 7/2008 |
| JP | 2009-147526 A | 7/2009 |
| JP | 4332726 B2 | 9/2009 |
| JP | 4731462 B2 | 7/2011 |
| JP | 2011-160214 A | 8/2011 |
| JP | 4820764 B2 | 11/2011 |
| JP | 2013-143726 A | 7/2013 |

\* cited by examiner

*Primary Examiner* — Siu Lee

(74) *Attorney, Agent, or Firm* — White & Case LLP

(57) ABSTRACT

According to one embodiment, a complex band pass filter comprises a first active filter circuit 10 to receive a first input signal on its input end and a second active filter circuit 20 to receive a second input signal on its input end, the second input signal having a 90-degree phase difference from the first input signal. A predetermined offset is imparted to the first input signal and the second input signal through the first and second signal level adjusting units (30, 40). A differential signal between the output signals of the first and second active filter circuits (10, 20) is outputted.

20 Claims, 8 Drawing Sheets

COMPLEX BAND PASS FILTER AND RECEIVER

CROSS-REFERENCE TO RELATED APPLICATIONS

This application is based upon and claims the benefit of priority from Japanese Patent Application No. 2014-15484, filed on Jan. 30, 2014; the entire contents of which are incorporated herein by reference.

FIELD

Embodiments described herein relate generally to a complex band pass filter (BPF) and a receiver comprising the complex BPF.

BACKGROUND

Conventionally, there have been known receivers of a superheterodyne system having adopted a low-IF scheme, which makes the local oscillation frequency closer to the reception frequency, thereby making the intermediate frequency considerably lower than the reception frequency. In the low-IF scheme, because the frequencies of a desired received signal and of an image signal are close to each other, the removal of the image signal is one of the tasks in configuring receivers. A technique using a complex BPF is disclosed in order to remove the image signal.

DETAILED DESCRIPTION

In general, according to one embodiment, there is provided a complex band pass filter having a first active filter circuit for a first input signal to be supplied to and a second active filter circuit for a second input signal to be supplied to, the second input signal having a 90-degree phase difference from the first input signal. The filter has first signal level adjusting unit that adjusts the level of the first input signal and second signal level adjusting unit that adjusts the level of the second input signal. The filter has a first feedback circuit that feeds back an output signal of the first active filter circuit to the input side of the second active filter circuit and a second feedback circuit that feeds back an output signal of the second active filter circuit to the input side of the first active filter circuit. The filter has output unit that outputs a differential signal between the output signal of the first active filter circuit and the output signal of the second active filter circuit, and a predetermined offset is imparted to the level of the first input signal and the level of the second input signal through the first signal level adjusting unit and the second signal level adjusting unit.

Exemplary embodiments of a complex band pass filter (BPF) and a receiver will be explained below in detail with reference to the accompanying drawings. The present invention is not limited to the following embodiments.

Figure 13A:
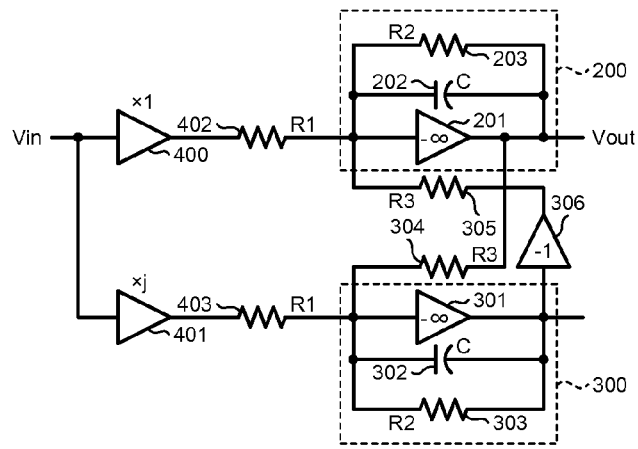
FIGS. 13A and 13B are a diagram and graph showing an example of a conventional complex BPF.

FIG. 13A is a diagram showing an example of a complex BPF for comparison with embodiments of the present invention. The complex BPF has active filter circuits (200, 300). The active filter circuit 200 comprises an operational amplifier 201 and a parallel circuit of a capacitor 202 and a resistor 203. The active filter circuit 300 comprises an operational amplifier 301 and a parallel circuit of a capacitor 302 and a resistor 303. A signal in phase with an input signal Vin of an intermediate frequency is supplied to the active filter circuit 200 via an amplifier circuit 400 and a resistor 402. A signal 90 degrees different in phase from the input signal Vin is supplied to the active filter circuit 300 via an amplifier circuit 401 and a resistor 403. In the actual circuit configuration, a high-frequency input signal and a signal from a local oscillation circuit (not shown) are mixed by a mixer (not shown) to perform frequency conversion, and an in-phase signal and a signal 90 degrees different in phase are generated and supplied to the active filter circuits (200, 300) via the resistors 402 and 403 respectively. For convenience of description, the complex BPF is shown as having a configuration where a signal in phase with the frequency-converted input signal Vin, obtained from the amplifier circuit 400, is supplied to the active filter circuit 200 via the resistor 402 and where a signal 90 degrees different in phase from the input signal Vin, obtained from the amplifier circuit 401, is supplied to the active filter circuit 300 via the resistor 403. That is, the amplifier circuit 401 is shown as having a function of shifting the phase by 90 degrees. The output of the active filter circuit 300 is fed back to the active filter circuit 200 via an inverting amplifier circuit 306 and a resistor 305, and the output of the active filter circuit 200 is fed back to the active filter circuit 300 via a resistor 304.

The transfer function Vout/Vin of the complex BPF shown in FIG. 13A can be expressed by the equation (1).

$$\frac{Vout}{Vin} = -\frac{R2}{R1} \times \frac{1}{1 + j(\omega - \omega_{offset})C \cdot R2} \quad (1)$$

The $\omega_{offset}$ in the equation (1) is a frequency offset amount, is set at $1/(C \cdot R3)$, and is offset from a local oscillation frequency by the magnitude of the intermediate frequency. The "$-\omega_{offset}$" is an image signal frequency. The absolute value $|Vout|/|Vin|$ of the transfer function is expressed by the equation (2).

$$\left|\frac{Vout}{Vin}\right| = \frac{R2}{R1} \times \frac{1}{\sqrt{1 + (\omega - \omega_{offset})^2 C^2 \cdot R2^2}} \quad (2)$$

Figure 13B:
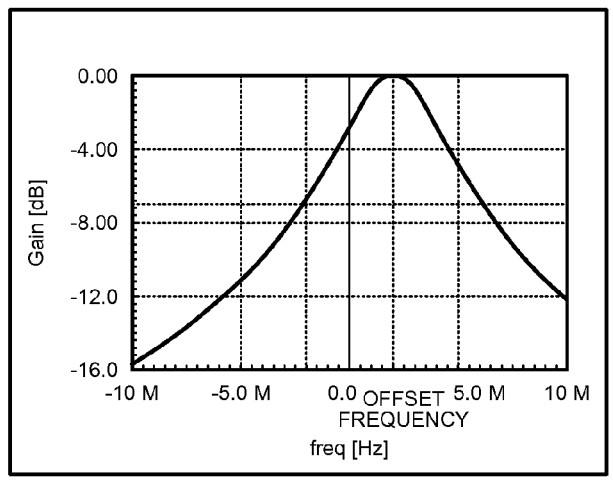

FIG. 13B shows the gain characteristic of the complex BPF. The center frequency of the complex BPF is offset from the local oscillation frequency of a local oscillator (not shown) by $\omega_{offset}$, and it appears as if the frequency $\omega$ in the complex BPF is shifted to ($\omega$-$\omega_{offset}$) in effect. That is, the gain characteristic shows a pass characteristic in the positive frequency region where a desired reception frequency exists and an attenuation characteristic in the negative frequency region where the image signal exists. By using this gain characteristic, the image signal can be removed.

It is possible to improve an image rejection ratio (IRR) by increasing the number of stages of complex BPFs, but the problems occur that as the number of stages increases, the current consumption increases and that the chip area of the semiconductor integrated circuit constituting the complex BPFs increases.

The complex BPFs and receivers according to embodiments will be described in detail below with reference to the accompanying drawings. The present invention is not limited to these embodiments.

Figure 1A:
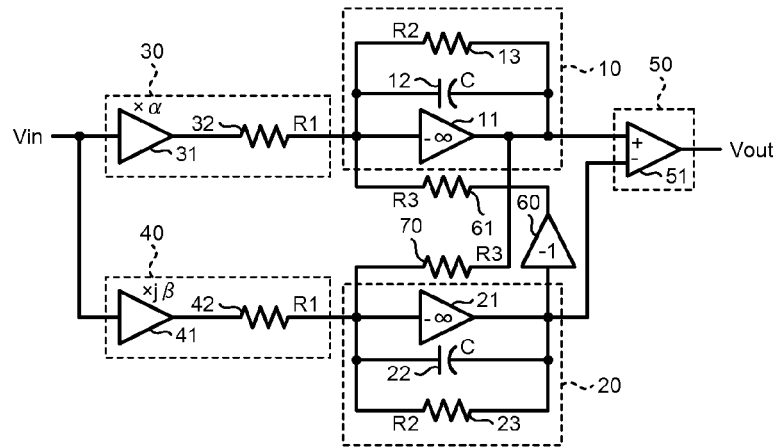
FIGS. 1A, 1B and 1C are a diagram and graphs respectively showing the operating principle and characteristics of embodiments.
Figure 1B:
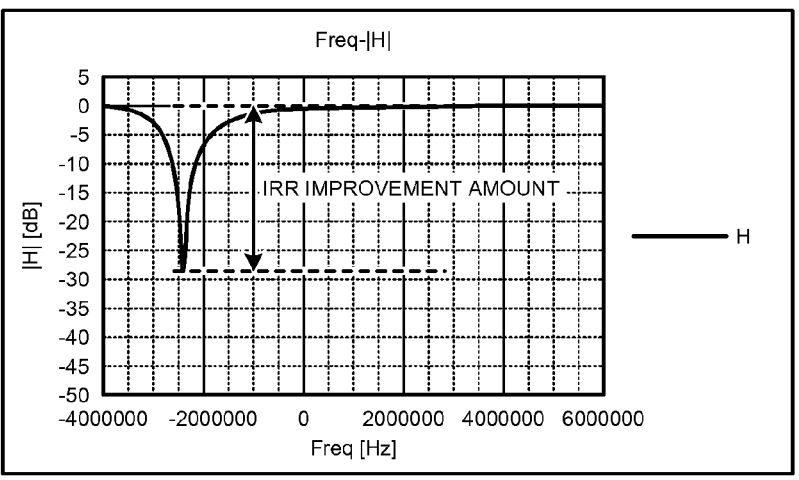
Figure 1C:
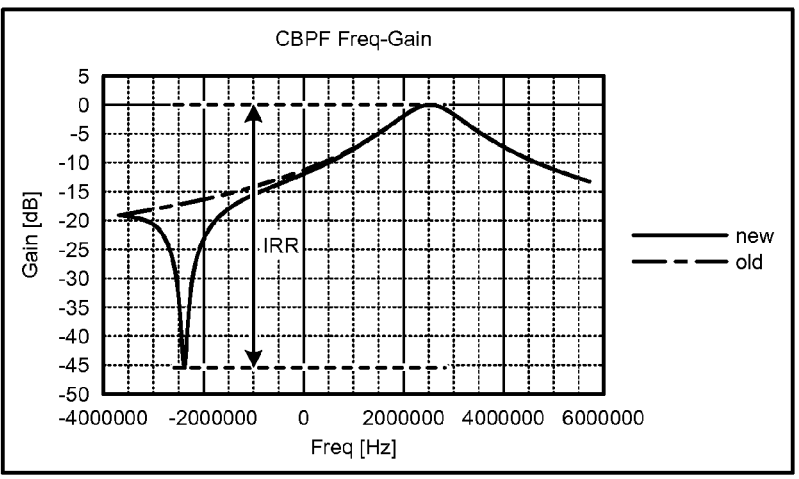

FIGS. 1A, 1B and 1C are a diagram and graphs showing the operating principle and characteristics of embodiments of the present invention. The complex BPFs according to the embodiments of the present invention have a first active filter circuit 10. The first active filter circuit 10 has an operational amplifier 11. A parallel circuit of a capacitor 12 having capacitance C and a resistor 13 having resistance R2 is connected between the input end and output end of the operational amplifier 11. Letters (C, R1, R2, etc.) attached to resistors and capacitors shown in the figure denote the values of capacitance and resistance. Hereinafter, the same applies. The complex BPFs have a second active filter circuit 20. The second active filter circuit 20 has an operational amplifier 21. A parallel circuit of a capacitor 22 having capacitance C and a resistor 23 having resistance R2 is connected between the input end and output end of the operational amplifier 21. The output of the second active filter circuit 20 is fed back to the input end of the first active filter circuit 10 via an inverting amplifier circuit 60 and a resistor 61. The output of the first active filter circuit 10 is fed back to the input end of the second active filter circuit 20 via a resistor 70 having resistance R3.

A signal in phase with the input signal Vin is inputted to the first active filter circuit 10 via a first signal level adjusting unit 30. The first signal level adjusting unit 30 has an amplifier circuit 31 having voltage gain α and a resistor 32 having resistance R1. A signal 90 degrees different in phase from the input signal Vin is inputted to the second active filter circuit 20 via a second signal level adjusting unit 40. The second signal level adjusting unit 40 has an amplifier circuit 41 having voltage gain β and a resistor 42 having resistance R1. Since an input signal 90 degrees different in phase from the signal supplied to the first active filter circuit 10 is supplied to the second active filter circuit 20, the amplifier circuit 41 is depicted as having a function of shifting the phase by 90 degrees, so as to match the description of the conventional complex BPF described using FIGS. 13A, 13B. The output of the first active filter circuit 10 and the output signal of the second active filter circuit 20 are supplied to a differential amplifier circuit 51 constituting an output unit 50. The differential amplifier circuit 51 outputs an output signal Vout that is a differential signal between the output signals of the first active filter circuit 10 and the second active filter circuit 20. The voltage gain of the differential amplifier circuit 51 is, for example, "1".

The transfer function Vout/Vin of the complex BPF shown in FIG. 1A is expressed by the equation (3).

$$\frac{Vout}{Vin} = -\frac{R2}{R1} \times \frac{1}{1 + j(\omega - \omega_{offset})C \cdot R2} \times H \quad (3)$$

The $\omega_{offset}$ in the equation (3) is 1/(C·R3). H in the equation (3) represents part of the transfer function improved by the embodiments of the present invention. The H representing the improved part of the transfer function is called an improvement transfer function. The improvement transfer function H is expressed by the equation (4).

$$H = \frac{1 + j[\omega(\alpha - j\beta) + \omega_{offset}(\beta - j\alpha)]C \cdot R2}{1 + j(\omega + \omega_{offset})C \cdot R2} \quad (4)$$

The absolute value |Vout|/|Vin| of the transfer function is expressed by the equation (5).

$$\left|\frac{Vout}{Vin}\right| = \left|\frac{R2}{R1}\right| \times \quad (5)$$

$$\sqrt{\frac{[\alpha + C \cdot R2(\beta \cdot \omega + \alpha \cdot \omega_{offset})]^2 + [\beta - C \cdot R2(\alpha \cdot \omega + \beta \cdot \omega_{offset})]^2}{[1 + C^2 \cdot R2^2(-\omega^2 + \omega_{offset}^2)]^2 + (2\omega \cdot C \cdot R2)^2}}$$

Likewise, the absolute value |H| of the improvement transfer function H is expressed by the equation (6).

$$|H| = \quad (6)$$

$$\sqrt{\frac{[\alpha + C \cdot R2(\beta \cdot \omega + \alpha \cdot \omega_{offset})]^2 + [\beta - C \cdot R2(\alpha \cdot \omega + \beta \cdot \omega_{offset})]^2}{[1 + C \cdot R2(\omega^2 + \omega_{offset}^2)]^2}}$$

FIG. 1B is a graph showing logarithmically the frequency characteristic of the absolute value |H| of the improvement transfer function H, with the local oscillation frequency as the center (0 Hz). The frequency characteristic of the absolute value |H| of the improvement transfer function H shows an attenuation characteristic in the negative frequency region where the image signal exists. Thus, signals of frequencies at and around the image signal frequency ($-\omega_{offset}$) can be attenuated, and hence the image rejection ratio (IRR) can be improved. By setting α, β included in the equation (6) as needed, the frequency characteristic of the improvement transfer function H can be adjusted. FIG. 1C shows the frequency characteristic of the gain. That is, FIG. 1C is a graph showing logarithmically the absolute value |Vout|/|Vin| of the transfer function Vout/Vin of the complex BPF. With the complex BPF of the embodiments of the present invention, the attenuation characteristic in the negative frequency region is improved over that of the conventional complex BPF indicated by a dot-dashed line, and the image rejection ratio (IRR) is improved. The attenuation amount can be adjusted through setting the voltage gain α of the amplifier circuit 31 and the voltage gain β of the amplifier circuit 41.

According to the embodiments of the present invention, the attenuation characteristic in the negative frequency region where the image signal exists is improved, and the image rejection ratio (IRR) is improved. Thus, the image rejection ratio (IRR) can be improved without increasing the number of stages of complex BPFs.

Next, the adjustment of the improvement transfer function H and the way of determining optimum values of the voltage gain α of the amplifier circuit 31 and the voltage gain β of the amplifier circuit 41 will be described. When replacing $\omega_{offset} \cdot C \cdot R2 = R2/R3$ in the equation (5) with ρ, the absolute value $|H|(w=-\omega_{offset})$ of the improvement transfer function at the image frequency and the absolute value $|H|(\omega=\omega_{offset})$ of the improvement transfer function at a desired signal frequency are expressed by the following equations (7) and (8).

$$|H|(\omega = -\omega_{offset}) = \sqrt{[\alpha + \rho(\alpha - \beta)]^2 + [\beta + \rho(\alpha - \beta)]^2} \quad (7)$$

$$|H|(\omega = \omega_{offset}) = \sqrt{\frac{[\alpha + \rho(\alpha + \beta)]^2 + [\beta - \rho(\alpha - \beta)]^2}{1 + (2\rho)^2}} \quad (8)$$

Figure 2:
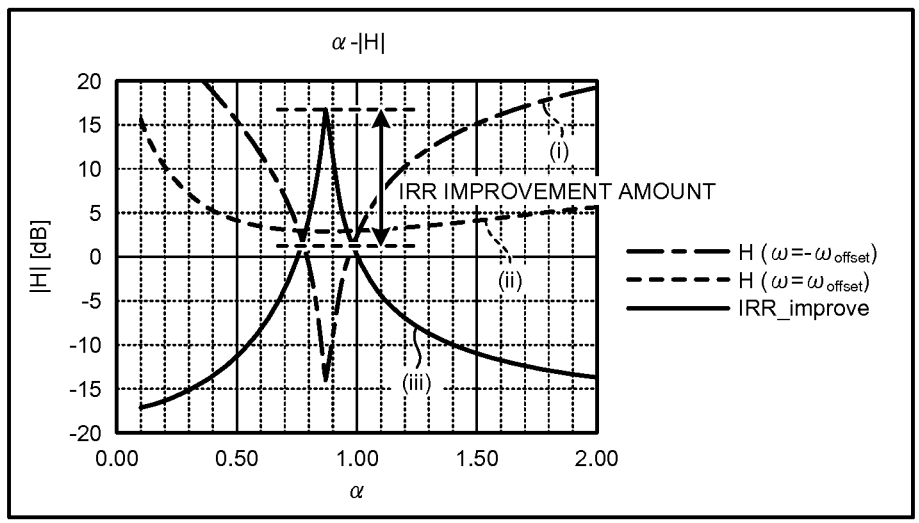
FIG. 2 is a graph for explaining the adjustment of the input signal level and change in characteristics of a complex BPF.

FIG. 2 is a graph where, with the voltage gain α of the amplifier circuit 31 and the voltage gain β of the amplifier circuit 41 being set to have a relation of β=1/α so that the gain is constant, the absolute values |H| of the improvement transfer function H at the desired signal frequency ($\omega_{offset}$) and at the image frequency ($-\omega_{offset}$) and their ratio $|H|(\omega=\omega_{offset})/|H|(\omega=-\omega_{offset})$ are plotted against the voltage gain α. Since the ρ is a constant determined by the ratio of resistance R2 to resistance R3, the voltage gain α of the amplifier circuit 31 and the voltage gain β of the amplifier circuit 41 are set to have a predetermined relation, so that $|H|(\omega=\omega_{offset})/|H|(\omega=-\omega_{offset})$ becomes a function of only α.

In FIG. 2, the dot-dashed line (i) indicates the improvement transfer function $H(\omega=-\omega_{offset})$ at the image frequency, and the broken line (ii) indicates the improvement transfer function $H(\omega=\omega_{offset})$ at the desired signal frequency. Hence, the difference between the two is an improvement amount IRR_improve of the image rejection ratio (IRR). The solid line (iii) indicates the improvement amount IRR_improve of the IRR. By setting the voltage gain α of the amplifier circuit 31 to the value at which the solid line (iii) takes on a maximum value, the improvement amount IRR_improve of the image rejection ratio (IRR) takes on a maximum value. By appropriately setting the voltage gain α of the amplifier circuit 31 and the voltage gain β of the amplifier circuit 41 each time ρ, i.e., resistances R2 and R3 change, a predetermined difference, i.e., an offset is imparted to the levels of the input signal to the first active filter circuit 10 and of the input signal to the second active filter circuit 20. By imparting the predetermined offset set through the voltage gains α, β to the input signals supplied to the first active filter circuit 10 and the second active filter circuit 20, the improvement amount IRR_improve of the image rejection ratio (IRR) of the complex BPF can be optimized. Note that because in this configuration the predetermined offset is imparted to the input signals to the first and second active filter circuits (10, 20) through the voltage gains α and β, α is not set equal to β.

First Embodiment

Figure 3:
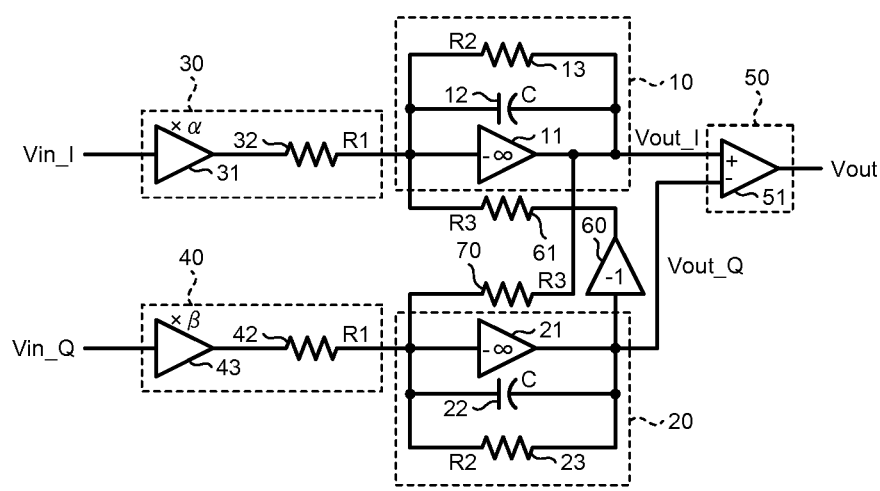
FIG. 3 is a diagram showing a complex BPF of a first embodiment.

FIG. 3 is a diagram showing the complex BPF of the first embodiment. The same reference numerals are used to denote constituents corresponding to those described with reference to FIG. 1. In the present embodiment, the first signal level adjusting unit 30 has the amplifier circuit 31 having the voltage gain α and the resistor 32 having resistance R1. A first input signal Vin_I is supplied to the amplifier circuit 31. The second signal level adjusting unit 40 has an amplifier circuit 43 having voltage gain β and a resistor 42 having resistance R1. A second input signal Vin_Q 90 degrees different in phase from the first input signal Vin_I is supplied to the amplifier circuit 43. The amplifier circuits (31, 43) forming part of the signal level adjusting units (30, 40) may be constituted by variable gain amplifier circuits.

As described for the operating principle of FIG. 1A, using the first active filter circuit 10 receiving the first input signal and the second active filter circuit 20 receiving the second input signal 90 degrees different in phase from the first input signal, a differential signal between the output signals of the first active filter circuit 10 and the second active filter circuit 20 is outputted from the output unit 50, and thus the complex BPF whose image rejection ratio (IRR) is improved can be provided. Further, since the output signal Vout is obtained from the differential signal between the output signal Vout_I of the first active filter circuit 10 and the output signal Vout_Q 90 degrees different in phase of the second active filter circuit 20, the output signals of the two active filter circuits (10, 20) are added in vector form, and thus the output is the square root of two times (about 1.4 times) as large as in the case of using the output of one active filter circuit, resulting in the effect that the gain is improved by 3 dB. Note that the amplification factor of the differential amplifier circuit 51 constituting the output unit may be increased to increase the gain.

Second Embodiment

Figure 4:
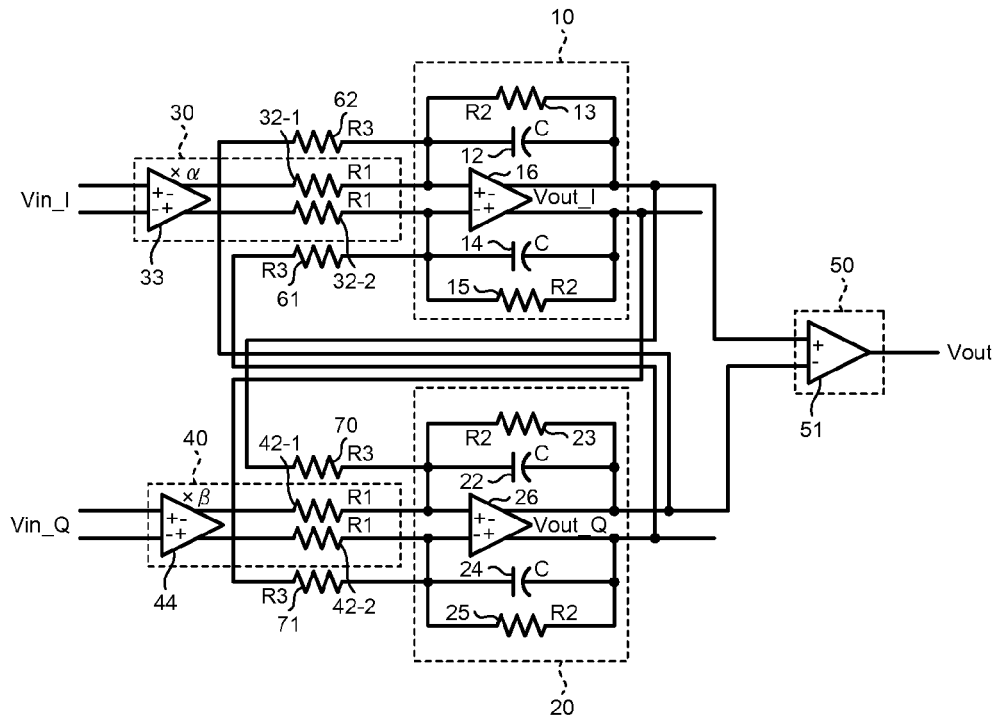
FIG. 4 is a diagram showing a complex BPF of a second embodiment.

FIG. 4 is a diagram showing the complex BPF of the second embodiment. The same reference numerals are used to denote constituents corresponding to those of the embodiment already described, with description thereof being omitted. In the present embodiment, the first active filter circuit 10 has a balanced amplifier circuit 16. A parallel circuit of a capacitor 12 and a resistor 13 is connected between the inverting output end and non-inverting input end of the balanced amplifier circuit 16. Likewise, a parallel circuit of a capacitor 14 and a resistor 15 is connected between the non-inverting output end and inverting input end of the balanced amplifier circuit 16. Likewise, the second active filter circuit 20 has a balanced amplifier circuit 26. A parallel circuit of a capacitor 22 and a resistor 23 is connected between the inverting output end and non-inverting input end of the balanced amplifier circuit 26. A parallel circuit of a capacitor 24 and a resistor 25 is connected between the non-inverting output end and inverting input end of the balanced amplifier circuit 26.

A first input signal Vin_I is supplied to the first active filter circuit 10 via the first signal level adjusting unit 30. The first signal level adjusting unit 30 has a balanced amplifier circuit 33 and resistors (32-1, 32-2). The inverting output end of the balanced amplifier circuit 33 is connected to the non-inverting input end of the balanced amplifier circuit 16 of the first active filter circuit 10 via the resistor 32-1, and the non-inverting output end of the balanced amplifier circuit 33 is connected to the inverting input end of the balanced amplifier circuit 16 via the resistor 32-2.

A second input signal Vin_Q is supplied to the second active filter circuit 20 via the second signal level adjusting unit 40. The second input signal Vin_Q has a 90-degree phase difference from the first input signal Vin_I. The second signal level adjusting unit 40 has a balanced amplifier circuit 44 and resistors (42-1, 42-2). The inverting output end of the balanced amplifier circuit 44 is connected to the non-inverting input end of the balanced amplifier circuit 26 of the second active filter circuit 20 via the resistor 42-1, and the non-inverting output end of the balanced amplifier circuit 44 is connected to the inverting input end of the balanced amplifier circuit 26 via the resistor 42-2.

The inverting output end of the balanced amplifier circuit 16 of the first active filter circuit 10 is connected to the non-inverting input end of the balanced amplifier circuit 26 of the second active filter circuit 20 via a resistor 70. The non-inverting output end of the balanced amplifier circuit 16 is connected to the inverting input end of the balanced amplifier circuit 26 via a resistor 71. The inverting output end of the balanced amplifier circuit 26 of the second active filter circuit 20 is connected to the non-inverting input end of the balanced amplifier circuit 16 of the first active filter circuit 10 via a resistor 62. The non-inverting output end of the balanced amplifier circuit 26 is connected to the inverting input end of the balanced amplifier circuit 16 via a resistor 61. The inverting output end of the balanced amplifier circuit 16 of the first active filter circuit 10 is connected to the non-inverting input end of the differential amplifier circuit 51 constituting the output unit 50, and the inverting output end of the balanced amplifier circuit 26 of the second active filter circuit 20 is connected to the inverting input end of the differential amplifier circuit 51.

In the present embodiment, the amplifier circuits forming part of the first and second active filter circuits (10, 20) are constituted by the balanced amplifier circuits. By making the configuration such that the output signal on the inverting output end of the balanced amplifier circuit 26 forming part of the second active filter circuit 20 is fed back to the balanced amplifier circuit 16 forming part of the first active filter circuit 10, the inverting amplifier circuit 60 of the first embodiment can be omitted.

Third Embodiment

Figure 5:
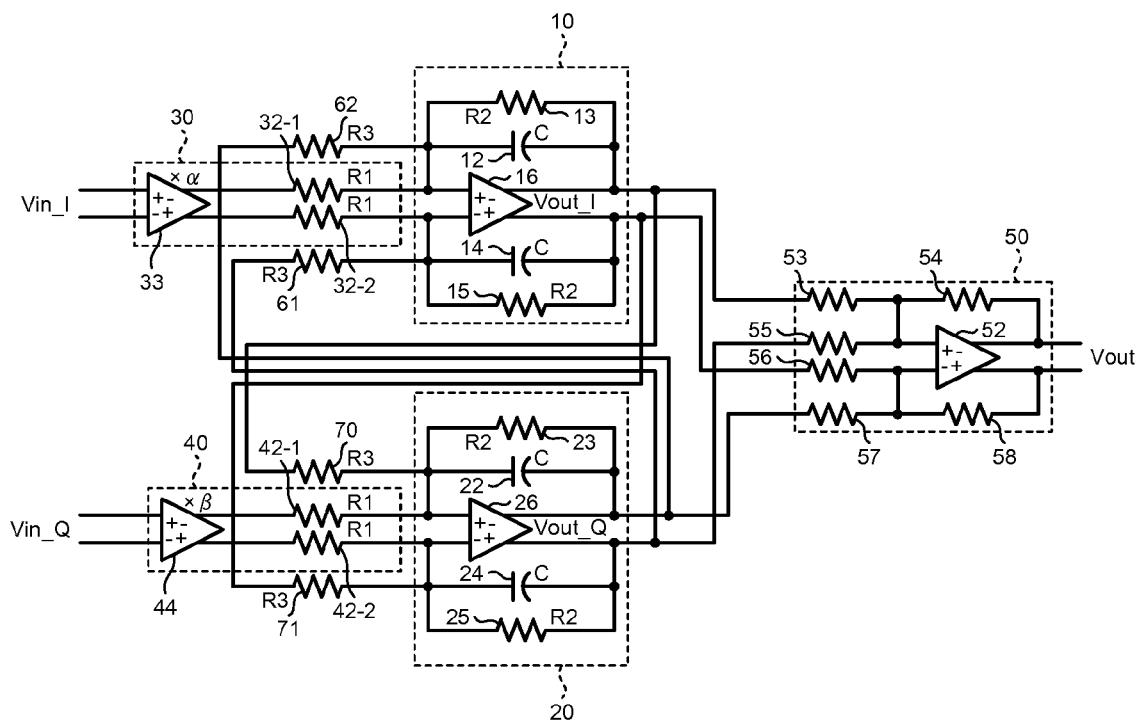
FIG. 5 is a diagram showing a complex BPF of a third embodiment.

FIG. 5 shows the complex BPF of the third embodiment. The same reference numerals are used to denote constituents corresponding to those of the embodiments already described, with description thereof being omitted. In the present embodiment, the output unit 50 has a balanced amplifier circuit 52. The non-inverting input end of the balanced amplifier circuit 52 is connected to the inverting output end of the balanced amplifier circuit 16 forming part of the first active filter circuit 10 via a resistor 53 and connected to the non-inverting output end of the balanced amplifier circuit 26 forming part of the second active filter circuit 20 via a resistor 55. The inverting input end of the balanced amplifier circuit 52 is connected to the non-inverting output end of the balanced amplifier circuit 16 of the first active filter circuit 10 via a resistor 56 and connected to the inverting output end of the balanced amplifier circuit 26 of the second active filter circuit 20 via a resistor 57. A resistor 54 is connected between the inverting output end and non-inverting input end of the balanced amplifier circuit 52, and a resistor 58 is connected between the non-inverting output end and inverting input end thereof. The voltage gain of the output unit 50 is set through the ratio of the resistors (53, 55, 56, 57) connected to the input end side of the balanced amplifier circuit 52 to the resistors (54, 58) connected between the input end and output end thereof.

In the present embodiment, the signal on the inverting output end of the balanced amplifier circuit 16 of the first active filter circuit 10 and the signal on the non-inverting output end of the balanced amplifier circuit 26 of the second active filter circuit 20 are added and supplied to the non-inverting input end of the balanced amplifier circuit 52. Likewise, the signal on the non-inverting output end of the balanced amplifier circuit 16 of the first active filter circuit 10 and the signal on the inverting output end of the balanced amplifier circuit 26 of the second active filter circuit 20 are added and supplied to the inverting input end of the balanced amplifier circuit 52. Thus, the output signal Vout of the balanced amplifier circuit 52 is a signal corresponding to the difference between the output signals of the balanced amplifier circuit 16 of the first active filter circuit 10 and the balanced amplifier circuit 26 of the second active filter circuit 20. The inverting output signals and non-inverting output signals of the two active filter circuits (10, 20) are respectively added and supplied to the input ends of the balanced amplifier circuit 52.

Fourth Embodiment

Figure 6:
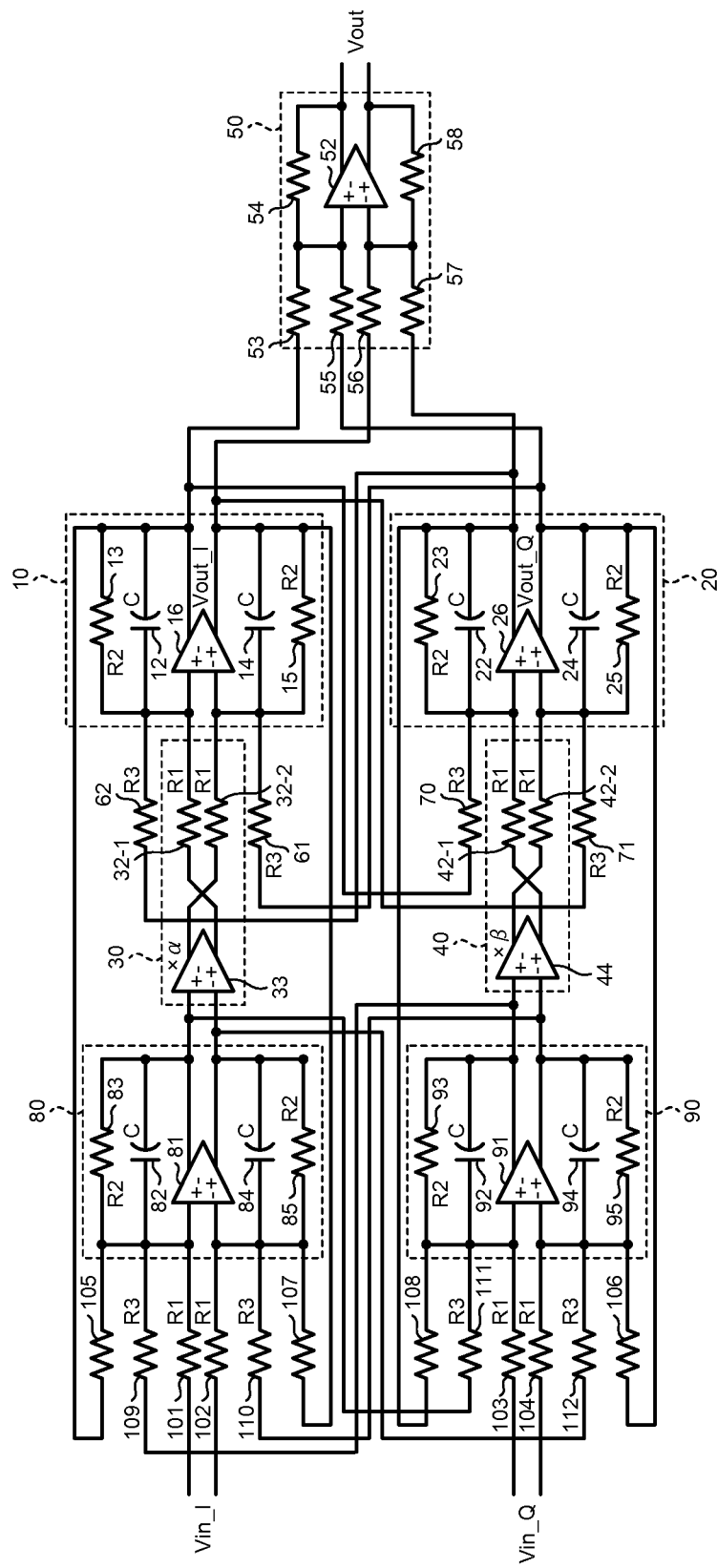
FIG. 6 is a diagram showing a complex BPF of a fourth embodiment.

FIG. 6 is a diagram showing the complex BPF of the fourth embodiment. The same reference numerals are used to denote constituents corresponding to those of the embodiments already described, with description thereof being omitted. In the present embodiment, the output of a third active filter circuit 80 is supplied to the first signal level adjusting unit 30. Also, the output of a fourth active filter circuit 90 is supplied to the second signal level adjusting unit 40. The third active filter circuit 80 comprises a balanced amplifier circuit 81. A parallel circuit of a capacitor 82 and a resistor 83 is connected between the inverting output end and non-inverting input end of the balanced amplifier circuit 81. Likewise, a parallel circuit of a capacitor 84 and a resistor 85 is connected between the non-inverting output end and inverting input end of the balanced amplifier circuit 81. Likewise, the fourth active filter circuit 90 has a balanced amplifier circuit 91. A parallel circuit of a capacitor 92 and a resistor 93 is connected between the inverting output end and non-inverting input end of the balanced amplifier circuit 91. A parallel circuit of a capacitor 94 and a resistor 95 is connected between the non-inverting output end and inverting input end of the balanced amplifier circuit 91.

The first input signal Vin_I is supplied to the balanced amplifier circuit 81 forming part of the third active filter circuit 80 via resistors 101 and 102. The second input signal Vin_Q is supplied to the balanced amplifier circuit 91 forming part of the fourth active filter circuit 90 via resistors 103 and 104. The second input signal Vin_Q has a 90-degree phase difference from the first input signal Vin_I.

The inverting output end of the balanced amplifier circuit 81 of the third active filter circuit 80 is connected to the non-inverting input end of the balanced amplifier circuit 91 of the fourth active filter circuit 90 via a resistor 111, and the non-inverting output end of the balanced amplifier circuit 81 is connected to the inverting input end of the balanced amplifier circuit 91 via a resistor 112. The inverting output end of the balanced amplifier circuit 91 of the fourth active filter circuit 90 is connected to the non-inverting input end of the balanced amplifier circuit 81 of the third active filter circuit 80 via a resistor 109, and the non-inverting output end of the balanced amplifier circuit 91 is connected to the inverting input end of the balanced amplifier circuit 81 via a resistor 110. The inverting output end of the balanced amplifier circuit 16 of the first active filter circuit 10 is connected to the non-inverting input end of the balanced amplifier circuit 81 of the third active filter circuit 80 via a resistor 105, and the non-inverting output end of the balanced amplifier circuit 16 is connected to the inverting input end of the balanced amplifier circuit 81 of the third active filter circuit 80 via a resistor 107.

The inverting output end of the balanced amplifier circuit 26 of the second active filter circuit 20 is connected to the non-inverting input end of the balanced amplifier circuit 91 of the fourth active filter circuit 90 via a resistor 108, and the non-inverting output end of the balanced amplifier circuit 26 is connected to the inverting input end of the balanced amplifier circuit 91 of the fourth active filter circuit 90 via a resistor 106. The third active filter circuit 80, the fourth active filter circuit 90, and the feedback circuit between the third and fourth active filters form a front-stage complex BPF circuit.

In the present embodiment, the outputs of the active filter circuit 80 of the front stage, to which the first input signal Vin_I is supplied, and the active filter circuit 90 of the front stage, to which the second input signal Vin_Q is supplied, are supplied to the first active filter circuit 10 of the rear stage and the second active filter circuit 20 of the rear stage via the first signal level adjusting unit 30 and the second signal level adjusting unit 40. That is, a second-order complex BPF is formed. The signal level adjusting units (30, 40) that supply input signals having an offset to active filter circuits are provided at the input part of the active filter circuits (10, 20) on the rear stage side. With the second-order complex BPF, the image rejection ratio (IRR) can be further improved.

Figure 7:
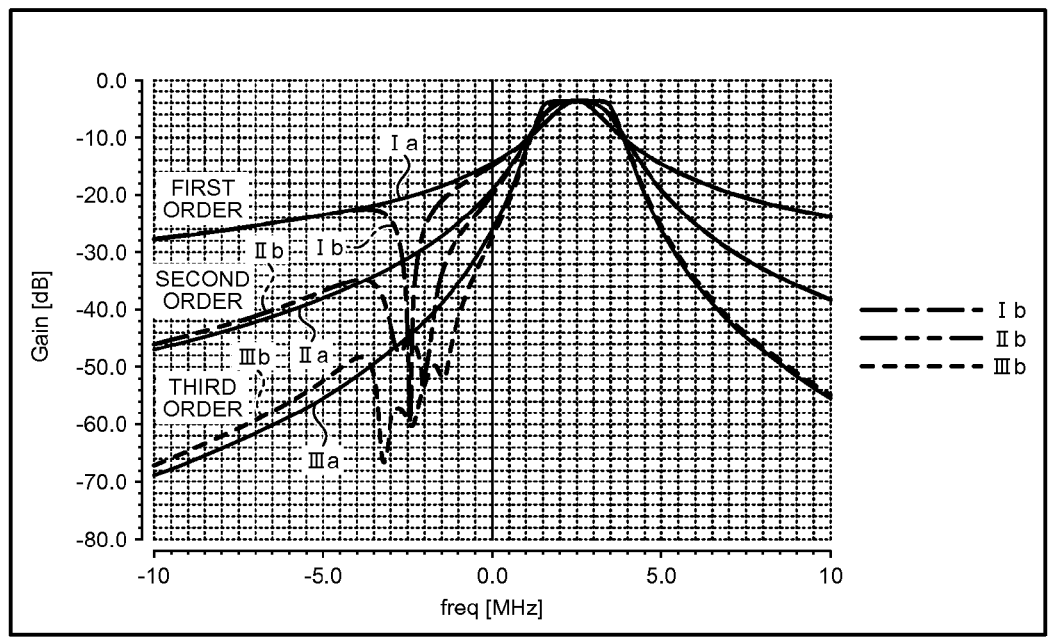
FIG. 7 is a graph showing change in characteristics of complex BPFs.

FIG. 7 is a graph showing the relation between the number of stages of active filter circuits forming part of the complex BPF, that is, the order and the gain. In this figure, Ia indicates the gain of a conventional first-order complex BPF circuit, and Ib indicates the gain characteristic of the first embodiment. Likewise, in this figure, IIa indicates the gain characteristic of a conventional second-order complex BPF, and IIb indicates the gain characteristic of an embodiment including a signal level adjusting unit at the input part of the active filter circuit on the rear side in a configuration including two stages of active filter circuits, that is, the second-order complex BPF of the fourth embodiment shown in FIG. 6. In this figure, IIIa indicates the gain characteristic of a conventionally configured third-order complex BPF, and IIIb indicates the gain characteristic of an embodiment of a third-order complex BPF comprising a signal level adjusting unit at the input part of the active filter circuit of the third stage, the final stage. By configuring the complex BPF to be of an order higher than one, the selectivity of frequencies to be transmitted and frequencies to be attenuated can be improved. Any of the cases shows that a complex BPF having the image rejection ratio (IRR) improved is provided by configuring the embodiment such that the inputs of the two active filter circuits have an offset. In the case where the complex BPF is configured to be of an order higher than one, the configuration where the first signal level adjusting unit 30 and the second signal level adjusting unit 40 are provided at the input parts of the first active filter circuit 10 and second active filter circuit 20 of the final stage is preferable in improving the image rejection ratio (IRR).

Fifth Embodiment

Figure 8:
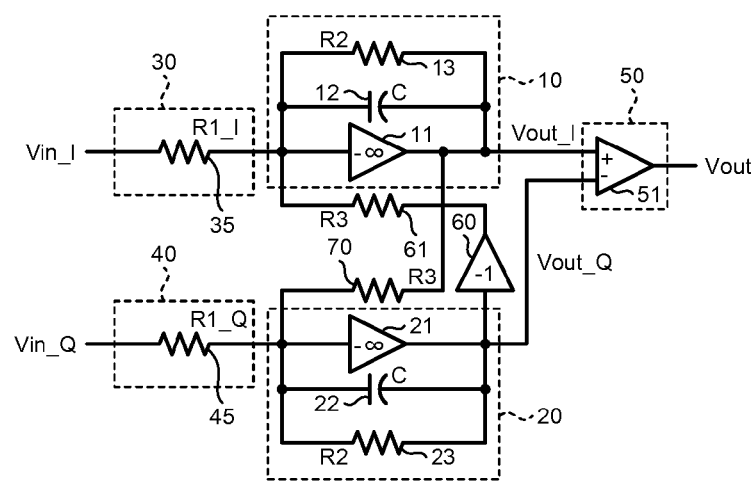
FIG. 8 is a diagram showing a complex BPF of a fifth embodiment.

FIG. 8 is a diagram showing the complex BPF of the fifth embodiment. The same reference numerals are used to denote constituents corresponding to those of the embodiment already described, with description thereof being omitted. In the present embodiment, the first signal level adjusting unit 30, which adjusts the level of the input signal supplied to the first active filter circuit 10, has a resistor 35 of resistance R1_I. Likewise, the second signal level adjusting unit 40, which adjusts the level of the input signal supplied to the second active filter circuit 20, has a resistor 45 of resistance R1_Q. The resistance R1_I of the resistor 35 is, for example, R1/α, and the resistance R1_Q of the resistor 45 is set at α×R1. By this means, this complex BPF can be made to correspond to the case of the first embodiment shown in FIG. 1 where the voltage gain β of the amplifier circuit 41 of the second signal level adjusting unit 40 is set at 1/α, α being the voltage gain of the amplifier circuit 31 of the first signal level adjusting unit 30. The complex BPF having a maximum image rejection ratio (IRR) can be provided by setting the resistances of the resistors 35 and 45 as needed and adjusting α and β. In the case of the configuration where a predetermined level difference, i.e., a predetermined offset is imparted to the input signals to the first and second active filter circuits (10, 20) through the resistors 35 and 45, the resistances of the resistors 35 and 45 are not set equal, that is, a is not set equal to 1. The resistors (35, 45) constituting the signal level adjusting units (30, 40) may be variable resistors.

In the present embodiment, the first and second signal level adjusting units (30, 40) that supply the level-adjusted input signals to the first and second active filter circuits can be constituted by the resistors (35, 45) having a predetermined resistance ratio. The circuit configuration is simplified as compared with the configuration including amplifier circuits, and power consumption can be reduced.

Sixth Embodiment

Figure 9:
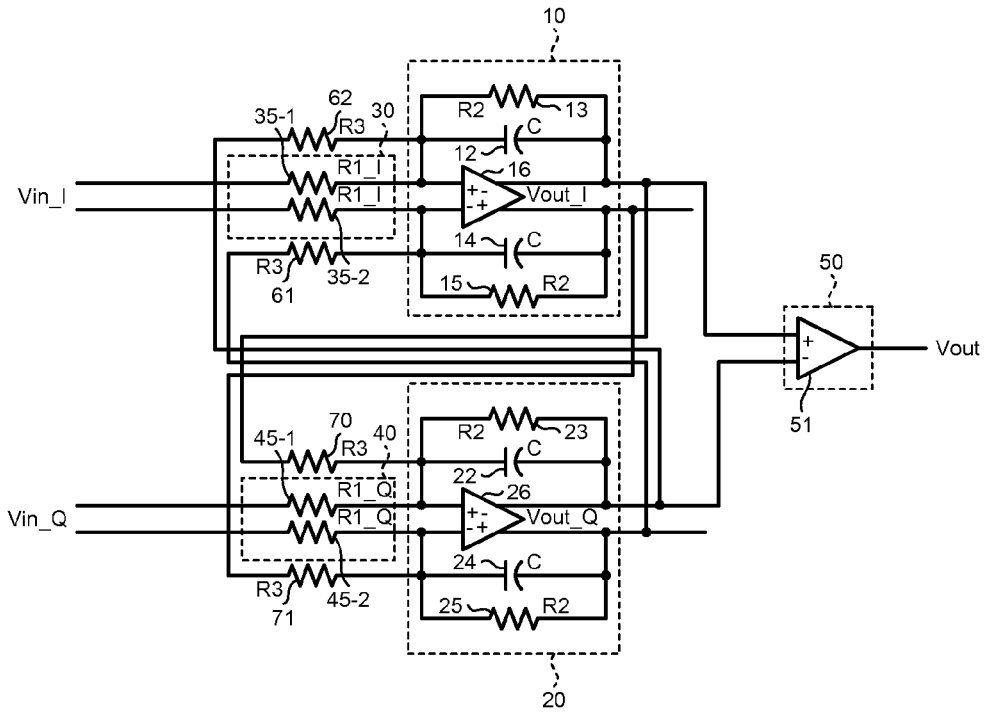
FIG. 9 is a diagram showing a complex BPF of a sixth embodiment.

FIG. 9 is a diagram showing the complex BPF according to the sixth embodiment. The same reference numerals are used to denote constituents corresponding to those of the embodiments already described, with description thereof being omitted.

In the present embodiment, the amplifier circuits forming part of the first and second active filter circuits (10, 20) are constituted by the balanced amplifier circuits (16, 26). The first input signal Vin_I is supplied to the first active filter circuit 10 via resistors (35-1, 35-2) constituting the first signal level adjusting unit 30. The second input signal Vin_Q is supplied to the second active filter circuit 20 via resistors (45-1, 45-2) constituting the second signal level adjusting unit 40. By making the configuration such that the output signal on the inverting output end of the balanced amplifier circuit 26 forming part of the second active filter circuit 20 is fed back to the balanced amplifier circuit 16 forming part of the first active filter circuit 10, the inverting output signal of the second active filter circuit 20 can be fed back to the first active filter circuit 10 without using the inverting amplifier circuit 60 of the fifth embodiment of FIG. 8.

Seventh Embodiment

Figure 10:
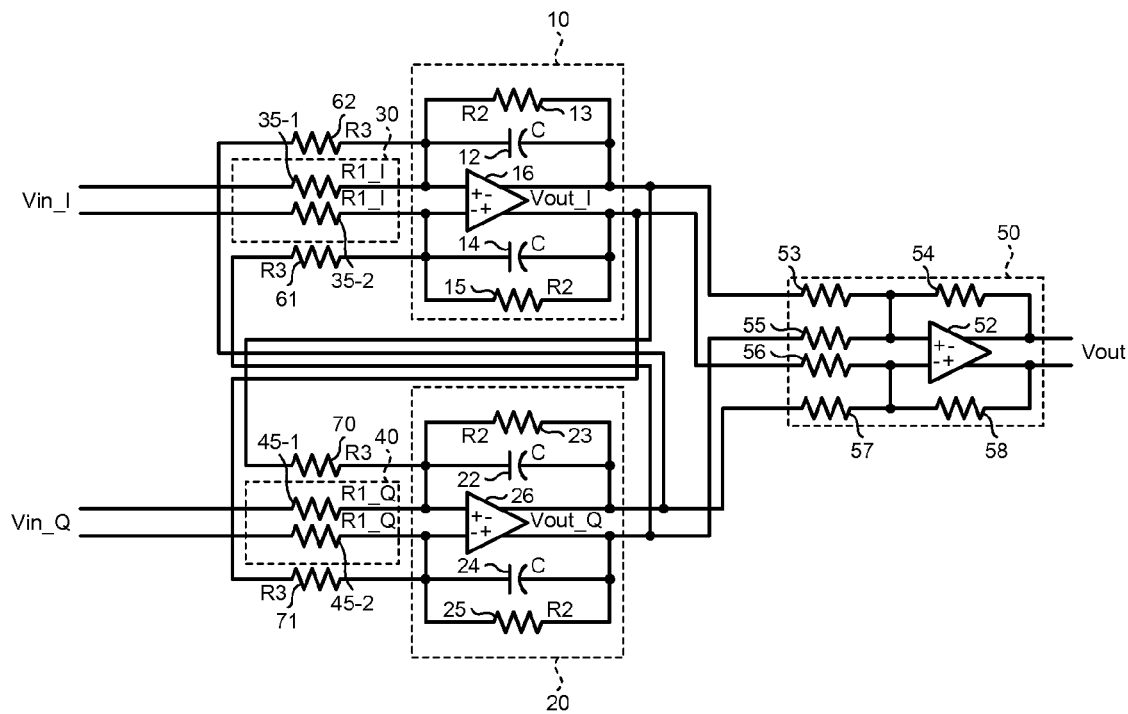
FIG. 10 is a diagram showing a complex BPF of a seventh embodiment.

FIG. 10 is a diagram showing the complex BPF according to the seventh embodiment. The same reference numerals are used to denote constituents corresponding to those of the embodiments already described, with description thereof being omitted.

In the present embodiment, the signal on the inverting output end of the balanced amplifier circuit 16 of the first active filter circuit 10 and the signal on the non-inverting output end of the balanced amplifier circuit 26 of the second active filter circuit 20 are added and supplied to the non-inverting input end of the balanced amplifier circuit 52 constituting the output unit 50. Likewise, the signal on the non-inverting output end of the balanced amplifier circuit 16 of the first active filter circuit 10 and the signal on the inverting output end of the balanced amplifier circuit 26 of the second active filter circuit 20 are added and supplied to the inverting input end of the balanced amplifier circuit 52. Thus, the output signal Vout of the balanced amplifier circuit 52 is a signal corresponding to the difference between the output signals of the balanced amplifier circuit 16 of the first active filter circuit 10 and the balanced amplifier circuit 26 of the second active filter circuit 20. The inverting output signals and non-inverting output signals of the two active filter circuits (10, 20) are respectively added and supplied to the input ends of the balanced amplifier circuit 52.

Eighth Embodiment

Figure 11:
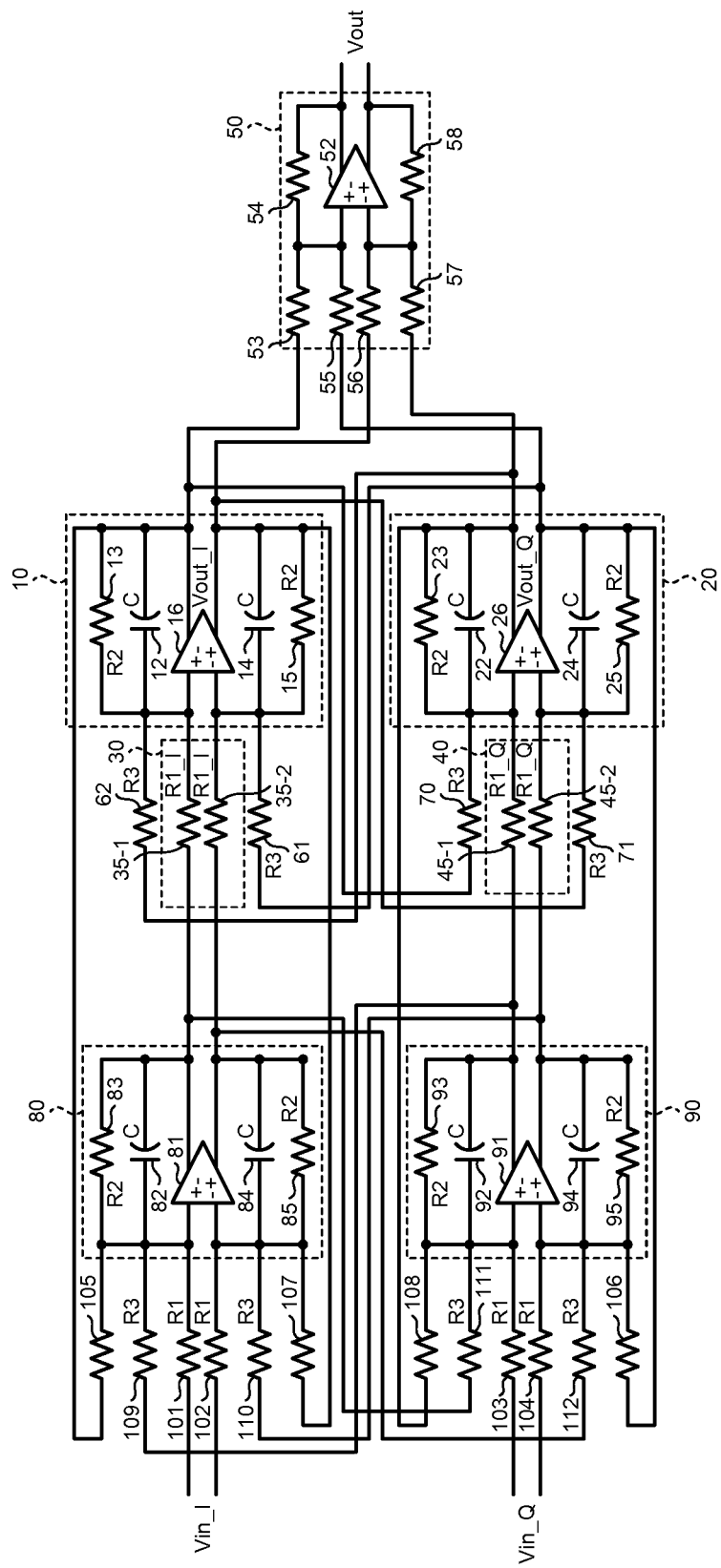
FIG. 11 is a diagram showing a complex BPF of an eighth embodiment.

FIG. 11 is a diagram showing the complex BPF according to the eighth embodiment. The same reference numerals are used to denote constituents corresponding to those of the embodiments already described, with description thereof being omitted.

In the present embodiment, the outputs of the active filter circuit 80 of the front stage, to which the first input signal Vin_I is supplied, and the active filter circuit 90 of the front stage, to which the second input signal Vin_Q is supplied, are supplied to the first active filter circuit 10 of the rear stage and the second active filter circuit 20 of the rear stage via the first signal level adjusting unit 30 and the second signal level adjusting unit 40. That is, this configuration comprises a second-order complex BPF circuit constituted by the third active filter circuit 80 and fourth active filter circuit 90 of the front stage and the first active filter circuit 10 and second active filter circuit 20 of the rear stage. By setting the resistance ratio of resistance R1_I of resistors (35-1, 35-2) of the first level adjusting unit 30 supplying the input signal to the first active filter circuit 10 provided at the rear stage to the resistance R1_Q of resistors (45-1, 45-2) of the second level adjusting unit 40 supplying the input signal to the second active filter circuit 20 as needed to adjust the setting values α and β of the signal level adjusting units (30, 40), the image rejection ratio (IRR) can be optimized. Further, by configuring the complex BPF to be of an order higher than one, the selectivity of frequencies to be transmitted and frequencies to be attenuated can be improved. In the case where the complex BPF is configured to be of an order higher than one, the configuration where the first signal level adjusting unit 30 and the second signal level adjusting unit 40 are provided at the input parts of the first active filter circuit 10 and second active filter circuit 20 of the final stage is preferable in improving the image rejection ratio (IRR).

Ninth Embodiment

Figure 12:
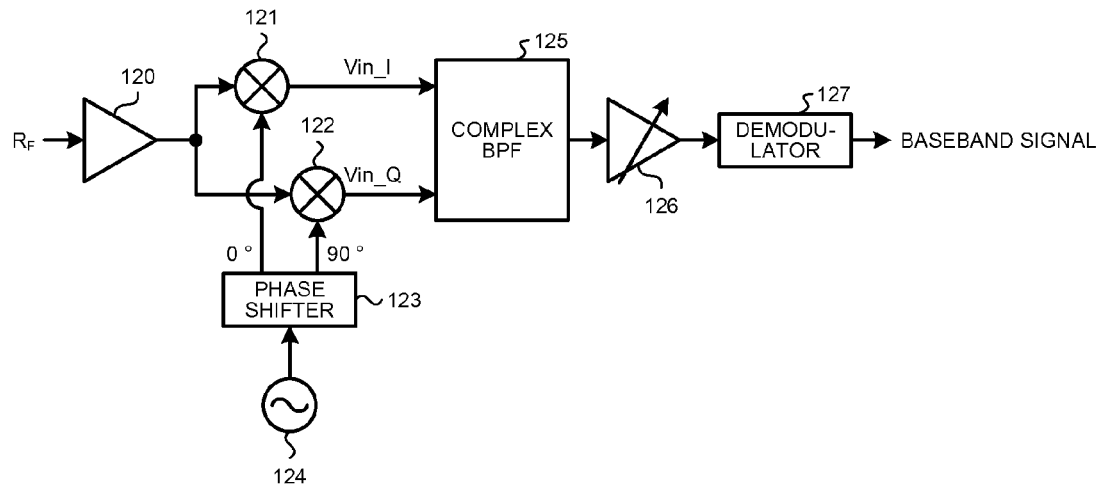
FIG. 12 is a diagram showing an embodiment of a receiver.

FIG. 12 is a diagram showing one embodiment of a receiver. The present embodiment comprises a high-frequency amplifier circuit 120 receiving a high-frequency input signal $R_F$. The output signal of the high-frequency amplifier circuit 120 is supplied to mixers (121, 122). The signal of a local oscillator 124 is supplied to a phase shifter 123, and the phase shifter 123 supplies signals 90 degrees different in phase to the mixers (121, 122). In the mixers (121, 122), the signal from the high-frequency amplifier circuit 120 and the signals from the phase shifter 123 are mixed to produce and supply the first input signal Vin_I and the second input signal Vin_Q 90 degrees different in phase to a complex BPF 125. As the complex BPF 125, the complex BPF of any of the embodiments already described can be used. The output of the complex BPF 125 is supplied to a variable gain amplifier circuit 126. The signal amplified by the variable gain amplifier circuit 126 is supplied to a demodulator 127. The demodulator 127 outputs a demodulated baseband signal.

By using the complex BPF having the image rejection ratio (IRR) improved of the present embodiments as the complex BPF 125, a receiver improved in image signal rejection is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A complex band pass filter comprising:
   a first active filter circuit for a first input signal to be supplied to;
   a second active filter circuit for a second input signal to be supplied to, the second input signal having a 90-degree phase difference from the first input signal;
   first signal level adjusting unit that adjusts the level of the first input signal;
   second signal level adjusting unit that adjusts the level of the second input signal;
   a first feedback circuit that feeds back an output signal of the first active filter circuit to the input side of the second active filter circuit;
   a second feedback circuit that feeds back an output signal of the second active filter circuit to the input side of the first active filter circuit; and
   output unit that obtains an output from a differential signal between the output signal of the first active filter circuit and the output signal of the second active filter circuit,
   wherein a predetermined offset is imparted to the level of the first input signal and the level of the second input signal through the first signal level adjusting unit and the second signal level adjusting unit.

2. The complex band pass filter according to claim 1, wherein the output unit has a differential amplifier circuit.

3. The complex band pass filter according to claim 1, wherein the first signal level adjusting unit and the second signal level adjusting unit each have an amplifier circuit.

4. The complex band pass filter according to claim 3, wherein letting α, being not one, be the gain of the amplifier circuit of the first signal level adjusting unit, the gain of the amplifier circuit of the second signal level adjusting unit is 1/α.

5. The complex band pass filter according to claim 4, having a configuration of an order higher than one where multiple stages of active filter circuits are provided, wherein the first active filter circuit provided with the first signal level adjusting unit and the second active filter circuit provided with the second signal level adjusting unit are placed at the final stage.

6. The complex band pass filter according to claim 1, wherein the first signal level adjusting unit and the second signal level adjusting unit are each constituted by a resistor.

7. The complex band pass filter according to claim 6, wherein letting α×R be the resistance of the resistor of the first signal level adjusting unit, α being not one, the resistance of the resistor of the second signal level adjusting unit is R/α.

8. The complex band pass filter according to claim 7, wherein the first active filter circuit and the second active filter circuit each have an operational amplifier having an input end and an output end, and a parallel circuit of a resistor and a capacitor, connected between the input end and output end of the operational amplifier.

9. The complex band pass filter according to claim 1, wherein the first active filter circuit and the second active filter circuit each have a balanced amplifier circuit having an inverting input end, a non-inverting input end, an inverting output end, and a non-inverting output end, and parallel circuits of a resistor and a capacitor, respectively connected between the inverting input end and the non-inverting output end and between the non-inverting input end and the inverting output end, wherein the first input signal is supplied across the non-inverting output end and the inverting input end of the balanced amplifier circuit of the first active filter circuit, wherein the second input signal is supplied across the non-inverting output end and the inverting input end of the balanced amplifier circuit of the second active filter circuit, wherein an output signal outputted from the non-inverting output end of the balanced amplifier circuit of the first active filter circuit and an output signal outputted from the inverting output end of the balanced amplifier circuit of the second active filter circuit are added to produce a first added signal, wherein an output signal outputted from the inverting output end of the balanced amplifier circuit of the first active filter circuit and an output signal outputted from the non-inverting output end of the balanced amplifier circuit of the second active filter circuit are added to produce a second added signal, and wherein the first added signal and the second added signal are supplied to the output unit.

10. The complex band pass filter according to claim 1, having a configuration of an order higher than one where multiple stages of active filter circuits are provided, wherein the first active filter circuit provided with the first signal level adjusting unit and the second active filter circuit provided with the second signal level adjusting unit are placed at the final stage.

11. A complex band pass filter of an order higher than one which includes multiple stages of active filter circuits, the complex band pass filter comprising:

a first active filter circuit for a first input signal to be supplied to;

a second active filter circuit for a second input signal to be supplied to, the second input signal having a 90-degree phase difference from the first input signal;

first signal level adjusting unit that adjusts the level of the first input signal;

second signal level adjusting unit that adjusts the level of the second input signal;

a first feedback circuit that feeds back an output signal of the first active filter circuit to the input side of the second active filter circuit;

a second feedback circuit that feeds back an output signal of the second active filter circuit to the input side of the first active filter circuit; and output unit that obtains an output from a differential signal between the output signal of the first active filter circuit and the output signal of the second active filter circuit, wherein a predetermined offset is imparted to the level of the first input signal and the level of the second input signal through the first signal level adjusting unit and the second signal level adjusting unit.

12. The complex band pass filter according to claim 11, wherein the first signal level adjusting unit and the second signal level adjusting unit each have an amplifier circuit.

13. The complex band pass filter according to claim 12, wherein the first active filter circuit provided with the first signal level adjusting unit and the second active filter circuit provided with the second signal level adjusting unit are placed at the final stage.

14. The complex band pass filter according to claim 11, wherein the first signal level adjusting unit and the second signal level adjusting unit are each constituted by a resistor.

15. The complex band pass filter according to claim 14, wherein the first active filter circuit provided with the first signal level adjusting unit and the second active filter circuit provided with the second signal level adjusting unit are placed at the final stage.

16. A receiver including a complex band pass filter which comprises:

a first active filter circuit for a first input signal to be supplied to;

a second active filter circuit for a second input signal to be supplied to, the second input signal having a 90-degree phase difference from the first input signal;

first signal level adjusting unit that adjusts the level of the first input signal;

second signal level adjusting unit that adjusts the level of the second input signal;

a first feedback circuit that feeds back an output signal of the first active filter circuit to the input side of the second active filter circuit;

a second feedback circuit that feeds back an output signal of the second active filter circuit to the input side of the first active filter circuit; and output unit that obtains an output from a differential signal between the output signal of the first active filter circuit and the output signal of the second active filter circuit, wherein a predetermined offset is imparted to the level of the first input signal and the level of the second input signal through the first signal level adjusting unit and the second signal level adjusting unit.

17. The receiver according to claim 16, wherein the first signal level adjusting unit and the second signal level adjusting unit each have an amplifier circuit.

18. The receiver according to claim 17, wherein the complex band pass filter has a configuration of an order higher than one where multiple stages of active filter circuits are provided, and the first active filter circuit provided with the first signal level adjusting unit and the second active filter circuit provided with the second signal level adjusting unit are placed at the final stage.

19. The receiver according to claim 16, wherein the first signal level adjusting unit and the second signal level adjusting unit are each constituted by a resistor.

20. The receiver according to claim 19, wherein the complex band pass filter has a configuration of an order higher than one where multiple stages of active filter circuits are provided, and the first active filter circuit provided with the first signal level adjusting unit and the second active filter circuit provided with the second signal level adjusting unit are placed at the final stage.

* * * * *